United States Patent
Solgat et al.

(10) Patent No.: US 10,403,801 B2
(45) Date of Patent: Sep. 3, 2019

(54) SUBSTRATE INSERT MOLDING WITH DEPOSITED LIGHT-GENERATING SOURCES

(71) Applicant: Rohinni, LLC, Coeur d'Alene, ID (US)

(72) Inventors: John A. Solgat, Vassar, MI (US); Orin Ozias, Austin, TX (US)

(73) Assignee: Rohinni, LLC, Coeur d'Alene, ID (US)

( * ) Notice: Subject to any disclaimer, the term of this patent is extended or adjusted under 35 U.S.C. 154(b) by 74 days.

(21) Appl. No.: 14/542,595

(22) Filed: Nov. 15, 2014

(65) Prior Publication Data

US 2015/0171289 A1    Jun. 18, 2015

Related U.S. Application Data

(60) Provisional application No. 61/903,391, filed on Nov. 13, 2013, provisional application No. 61/905,155, filed on Nov. 15, 2013.

(51) Int. Cl.
| | |
|---|---|
| *H01L 33/54* | (2010.01) |
| *B29C 45/14* | (2006.01) |
| *H01L 25/075* | (2006.01) |
| *B29K 69/00* | (2006.01) |

(Continued)

(52) U.S. Cl.
CPC ........ *H01L 33/54* (2013.01); *B29C 45/14639* (2013.01); *H01L 25/0753* (2013.01); *B29K 2069/00* (2013.01); *B29K 2105/0032* (2013.01); *B29K 2995/002* (2013.01); *B29K 2995/0026* (2013.01); *B29K 2995/0035* (2013.01); *H01L 33/505* (2013.01); *H01L 2924/0002* (2013.01); *H01L 2933/005* (2013.01); *H01L 2933/0041* (2013.01); *Y10T 29/49146* (2015.01)

(58) Field of Classification Search
CPC ....... H01L 33/54; H01L 33/507; H01L 33/56; H01L 33/505; H01L 2933/0041; H01L 2933/005; H01L 25/0753; B29C 45/14639; B29K 2069/00; B29K 2995/0026; B29K 2995/0035; Y10T 29/49146; Y10T 29/4913; Y10T 29/49124; Y10T 29/49117; Y10T 29/49002
USPC ......... 29/841, 832, 829, 825, 592.1; 257/88; 264/21, 272.11, 272.17
See application file for complete search history.

(56) References Cited

U.S. PATENT DOCUMENTS 4,003,544 A * 1/1977 Bliven .............. B29C 45/14655
                                                            249/95
6,137,224 A * 10/2000 Centofante ....... B29C 45/14311
                                                            257/E21.504

(Continued)

FOREIGN PATENT DOCUMENTS

EP     2371510 B1     10/2013

OTHER PUBLICATIONS

IMD (Injection Moulding Decoration, In-Mould-Decoration), JUJO Technical Information, JUJO Chemical, http:/www.jujo-chemical.co.jp, Jan. 2005, 3 pages.

*Primary Examiner* — Peter Dungba Vo
*Assistant Examiner* — Azm A Parvez
(74) *Attorney, Agent, or Firm* — Lee & Hayes, P.C.

(57) ABSTRACT

Disclosed herein are technologies related to film-insert molding (FIM) with deposited light-generating sources, such as printed light-emitting diodes. This Abstract is submitted with the understanding that it will not be used to interpret or limit the scope or meaning of the claims.

17 Claims, 2 Drawing Sheets

(51) Int. Cl.
*B29K 105/00* (2006.01)
*H01L 33/50* (2010.01)

(56) References Cited

U.S. PATENT DOCUMENTS

| | | | | |
|---|---|---|---|---|
| 7,616,448 | B2* | 11/2009 | Degenkolb | H05K 3/284 |
| | | | | 174/50.5 |
| 8,088,636 | B2 | 1/2012 | Lai | |
| 8,415,879 | B2* | 4/2013 | Lowenthal | H01L 25/048 |
| | | | | 313/506 |
| 2002/0153523 | A1* | 10/2002 | Bernius | H01L 51/5253 |
| | | | | 257/40 |
| 2006/0261364 | A1* | 11/2006 | Suehiro | H01L 33/56 |
| | | | | 257/100 |
| 2006/0272150 | A1* | 12/2006 | Eguchi | H05K 3/284 |
| | | | | 29/841 |
| 2014/0355251 | A1 | 12/2014 | Kahrs et al. | |

* cited by examiner

SUBSTRATE INSERT MOLDING WITH DEPOSITED LIGHT-GENERATING SOURCES

PRIORITY CLAIM AND CROSS-REFERENCE TO RELATED APPLICATIONS

This application claims the benefit under 35 U.S.C. § 119(e)(1) of U.S. Provisional Application No. 61/905,155, filed Nov. 15, 2013; and No. 61/903,391, filed Nov. 13, 2013, which are hereby incorporated by reference in their entirety.

BACKGROUND

The terms in-mold decoration (IMD), in-mold labeling (IML), and film insert molding (FIM) refer to the same general concept of fusing a material having some indicators (e.g., graphics and lettering) thereon into a plastic mold. In some camps, the meaning of each term (IMD, IML, and FIM) may differ in some in their nuances.

According to Wikipedia, in-mould (or mold) decoration is described:

In-mould decoration is a special type of plastic moulding that is used for decorating plastic surfaces with color and/or with an abrasion resistant coat.

A carrier foil is placed inside the opened mould. It carries the dried paint layers, which are to be transferred to the plastic part, with the paint facing the gate. After filling with plastic the paint adheres to the plastic, and is removed from the carrier when opening the mould. For the next cycle the carrier foil is advanced, positioning the next area to be transferred.

Another website (www.juju-chemical.com) describes in-mold decoration (IMD) in this manner:

IMD is resin-moulding system that has been rapidly developing recently. In a broad sense, IMD means whole insert-moulding. In a narrow sense, it means the system in which the preliminarily-moulded film is insert-moulded. The process is: printing—preliminary-moulding—trimming—injection moulding—finished product.

There are three kinds of preliminary moulding: high-pressure moulding, vacuum moulding and press-moulding with metal dice. Preliminarily-moulded film is trimmed and adhered to the resin in the injection moulding machine. The unprinted side of the film generally comes on the surface of the finished product face up, which means that the printed ink is sandwiched between the film and resin. As the ink is covered with the film, abrasion resistance becomes good. The ink which is used for IMD must have conflicting properties: flexibility to cope with moulding and the resistance to heat and pressure of injection process Wikipedia describes In-Mould (mold) labeling in this manner:

In-mould labelling is the use of paper or plastic labels during the manufacturing of containers by blow molding, injection molding, or thermoforming processes. The label serves as the integral part of the final product, which is then delivered as pre-decorated item. Combining the decoration process with the moulding process cuts the total cost. The technology was first developed by Owens-Illinois in cooperation with Procter & Gamble to supply pre-labelled bottles that could be filled on the product filling line. This was first applied to Head & Shoulders shampoo bottles.

In-mould labelling (IML) was initially designed for blow molding, though developments using injection molding or thermoforming with reel-fed systems have increased the efficiency of the labelling process. The original concept involves coating the reverse side of the label with a heat seal layer, followed by a substrate material in which heat resistant ink is applied to. A heat resistant coating of lacquer is then applied. This process eliminates the need to flame treat the bottles prior labelling to achieve adequate adhesion.

There are several techniques for conducting the in-mould labelling process. Vacuum and compressed air can be used to handle the labels, also static electricity can be used. Electrostatic charging electrodes charge a label while it is being transferred to the moulding machine, so that when the label is placed on the tool and released by the labelling robot, it will wrap itself onto the tool. Most robot systems for placement of labels are not required for specific moulding machines and can be used with up to date presses with fast clamping systems.

Labels may be paper or a similar material to the moulded product. Polypropylene or polystyrene is commonly used as label material, with a thickness of 15 to 40 micrometers. Cavitated label material is also used. This is a sandwich material, having a spongy layer bonded between two very thin solid layers. An advantage of cavitated film is better conformance to small-radius curves on a product. Laminated film can be used to decorate products, yielding high wear-resistance. This type of film has the printed surface protected by a second layer of film, with a thickness of 30 or 40 micrometers. Products using this type of label might include picnic-ware, mouse-mats, or internal automotive components.

In-mould labeling is a popular method of decorating injection-molded parts for consumer electronics and for plastic bottles. Notebook computer and cellphone manufacturers are adopting IML technology for greater wear resistance than spray painting or pad-printing. IML can provide greater decorating options than other methods. Multi-color screen printed and offset lithography printed graphics are used to produce products with higher quality graphics than available with other decorating methods. Most applications in this area use second surface graphics. The decoration is printed on the back side of a clear substrate, typically polycarbonate or acrylic 0.125 mm to 0.375 mm thick. The injection plastic is on the ink side of the film. This encapsulates the decoration between the film layer and the injected plastic resulting in a decoration that can't be abraded during use. Vision systems can check for accurate label positioning, and can validate label correctness.

At website at www.lgintl.com describes Film Insert Molding in this manner:

Film Insert Molding (FIM), [is a type of] Mold Decorating (IMD) is a new, highly advanced method of applying printed graphics to molded plastic parts. The label is seamlessly integrated into the housing of the part, eliminating the need for post production labeling. FIM can be used to apply clear scratch-resistant hardcoats, logos, text and graphics, in any color or combination of colors, to plastic parts prior to injection molding. The final product is highly durable and ideal for handheld devices, electronic equipment and even point-of-purchase displays The context of the technology is in the realm of in-mold decorating (IMD), in-mold labeling (IML), and film-insert molding (FIM) as introduced above and has known to those of skill in the art. Herein, unless the particular context indicates otherwise, the terms IMD is a general label that encompasses IMD, IML, and FIM technologies.

BRIEF DESCRIPTION OF THE DRAWINGS

The Detailed Description references the accompanying figures. In the figures, the left-most digit(s) of a reference number identifies the figure in which the reference number first appears. The same numbers are used throughout the drawings to reference like features and components.

DETAILED DESCRIPTION

Disclosed herein are technologies related to film-insert molding (FIM) with deposited light-generating sources, such as printed light-emitting diodes (pLEDs).

Conventionally, there are difficulties involved in using semiconductors (like LEDs) and their circuitry with of in-mold decorating (IMD). These difficulties are discussed in these references:

U.S. Pat. No. 6,137,224;
DE102007011123;
EP 2371510.

Some of those difficulties include:

Temperature sensitivities of the conventional electronic components;
Difficulty (and thus cost) of handling and placing the conventional electronic components;
Effective sealing with the conventional electronic components;
Thickness of the conventional electronic components (and their substrates).

For example, the thermoplastic encapsulating material (e.g., resin) or the IMD process itself may destroy the conventional semiconductors (like LEDs) and/or their circuitry.

Example Implementation

For the purposes of the discussion herein, the term substrate insert molding (SIM) covers the process of IMD, IML, and/or FIM as applied to the described new approach and technology.

In general, the example implementation involves the encapsulation of a lighted substrate by injection molding a light-transmissive (e.g., transparent or translucent) thermoplastic encapsulating material that covers and mechanically bonds with the substrate.

The lighted substrate has is a thin film (e.g., polyester) having deposited (e.g., printed) light-generating sources (such as pLEDs).

The lighted substrate may be created via this example process:

printing a trace of conductive material (e.g., silver ink or ink with conductive nano-fibers) on non-conductive substrate (e.g., polyester);
  using ink with pLEDs dispersed therein, printing shapes/areas/regions of pLEDs over the traces;
  printing a dielectric (i.e., insulating) layer to separate conductive material layers;
  printing another trace of conductive material (e.g., silver ink or ink with conductive nano-fibers) over the shapes/areas/regions of pLEDs thus completing a circuit (once attached to a power source) therethrough the pLEDs a circuitry The lighted substrate has an interface tail extending from the finished mold. The interface has an electronic circuit connection for powering and controlling the light-generating sources.

An encapsulating material is typically a thermoplastic resin, which is often chosen from among the groups of polycarbonates and acrylics.

In some implementations, a diffusing layer may be layered over one side of the light substrate.

Figure 1:
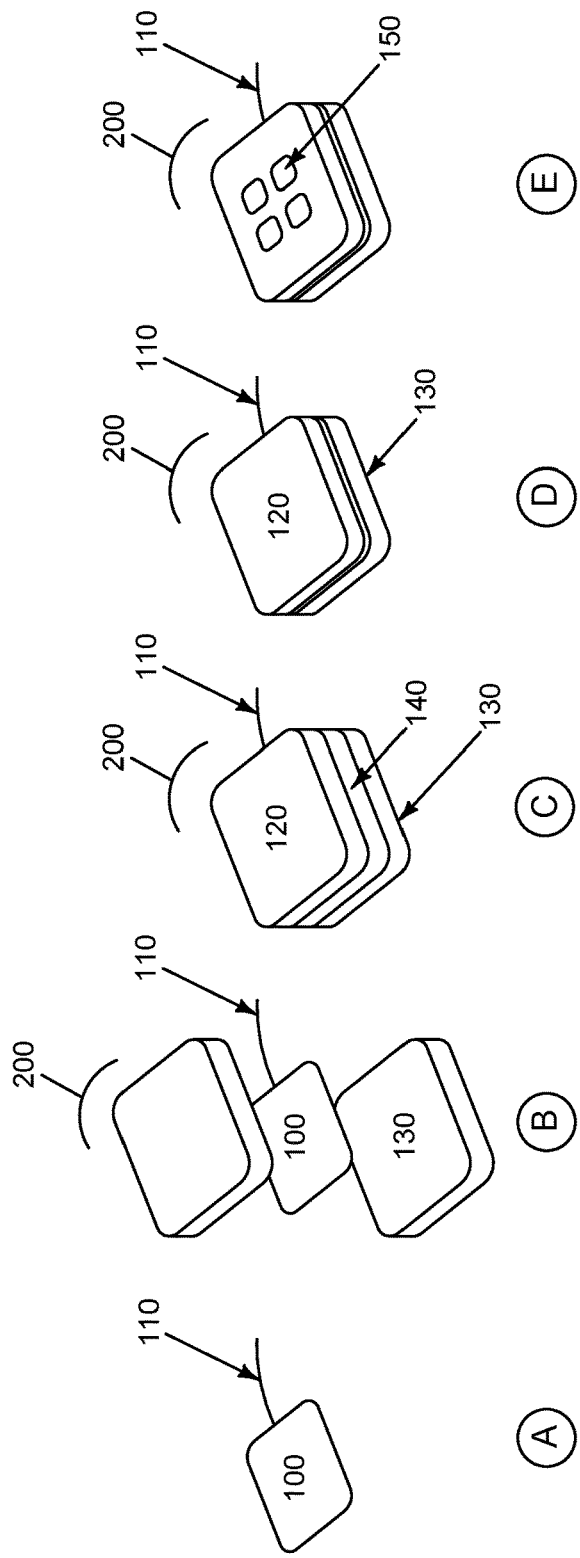
FIG. 1 shows an example system in accordance with one or more implementations described herein.

FIG. 1 shows five sub-figures A-E that illustrate an example SIM process and the resulting product of that process.

FIG. 1A shows a lighted substrate 100, such as a thin film having deposited (e.g., printed) light-generating sources (such as pLEDs) thereon. Extending from the substrate is an interface tail 110. The thin interface tail 110 is typically an extension of the same substrate material. It includes the circuitry for connecting the light-generating sources to power and/or control signals.

This can also be done by covering the traces with a mold feature such that they are exposed after the molding process to contact with a separate connector. Examples would be Cell phone antennas that are printed on the back of a plastic housing.

FIG. 1B shows a mold 200 having a top mold 120 and a bottom mold 130. The mold 200 is composed of a polycarbonates and acrylics (or the like) material. Typically, the top mold 120 will be light-transmissive (e.g., transparent or translucent). Note that the lighted substrate 100 is interposed between the top mold 120 and the bottom mold 130.

In addition, a diffusing film adhered to the lighted substrate or the light-transmissive mold. Alternatively, colored pigments may be added to translucent or transparent polymers of the molds or the transmissive thermoplastic encapsulating material. In other implementations, phosphor and/or diffusers may be layers or printed on the lighted substrate and/or the light-transmissive mold or the transmissive thermoplastic encapsulating material.

FIG. 1C shows the same mold 200, but with the top mold 120 and bottom mold 130 sandwiching the lighted substrate 100 therebetween. A light-transmissive thermoplastic encapsulating material 140 is introduced between the top and bottom mold. It covers the lighted substrate 100 and when pressed together (and possibly heated), it mechanically bonds with the substrate and to the top and bottom molds. Note that the interface tail 110 extends out and away from the mold 200.

FIG. 1D shows the mold 200 after completion of the SIM process. The top mold 120 and bottom mold 130 are fused together as one solid and integrated whole. The interface tail 110 extends from the mold 200, but, since the substrate is made from thin and compatible material (e.g., thermally compatible), it is sealed in the mold 200. No hole around the tail 110 is left.

FIG. 1E shows the mold 200 with a pattern 150 of light-generating sources (such as pLEDs) on the fully encapsulated lighted substrate 100 illuminated. This, of course, presumes that the interface tail 110 is connected to a power source (e.g., battery), which is not shown.

In some implementations, the power source might be encapsulated in the mold 200 or attached directly to the mold.

Unlike conventional approaches, it is not necessary to protect the electronic components (e.g., LEDs, wiring, traces, circuit board, substrate, etc.) from the thermal process of conventional IMD, IML, and/or FIM processes. Conventional electronic components are destroyed by thermal and/or plastic encapsulation of the conventional IMD, IML, and/or FIM processes.

The new SIM process described herein may use the same thermal and/or plastic encapsulation of the conventional IMD, IML, and/or FIM processes that would destroy the conventional electronic components (e.g., LEDs, wiring, traces, circuit board, substrate, etc.). The difference here is that the new electronic components (such as light-generating sources) themselves, the new way of creating the circuitry (e.g., depositing (e.g., printing) the circuitry and the active electronic components (e.g., LEDs)), and the use of a material for the substrate that is fully compatible with heat and encapsulation process.

In addition, the interface tail 110 is fully sealed. Therefore, unlike conventional approaches the finished mold is impervious to liquid intrusion. That is, it will not leak and allow moisture inside to interfere with the encapsulated electronics.

Alternatively, instead of using a tail, some implementations may employ a contact-and-spring type connector. With such a connector, circuitry of the lighted substrate is conductively connected internally to a conductive contact that is exposed on the outer surface of the overall unit. There is no physical hole that will allow liquid ingress. Instead, the contact allows for connection to another metal (often a spring) conductor that is attached to a power source (e.g., battery) and/or a controller.

Figure 2:
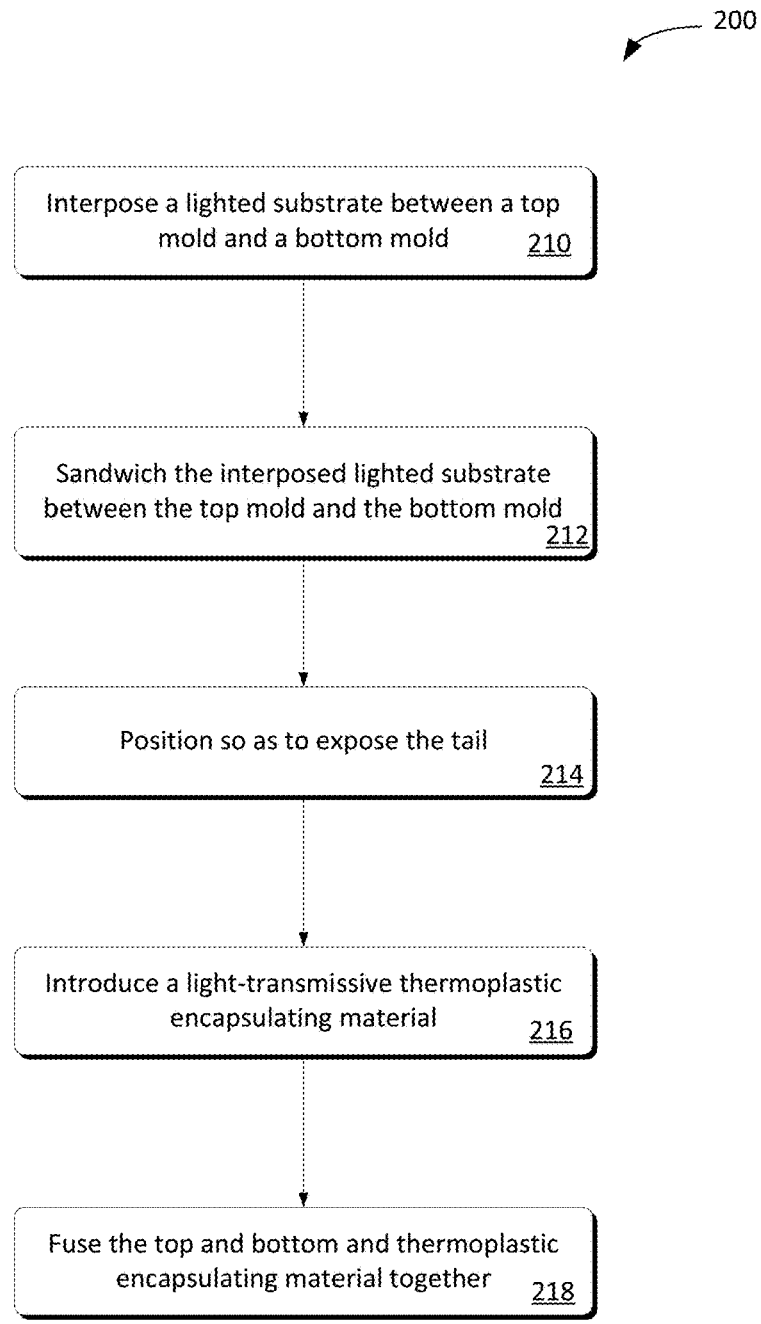
FIG. 2 shows an example process in accordance with one or more implementations described herein.

FIG. 2 shows a process 200 for implementing the technology discussed herein. The process discussed herein may be implemented by one or more machinery components as part of a manufacturing facility.

At 210, the manufacturing machinery interposes a lighted substrate between a top mold and a bottom mold, wherein the lighted substrate is a thin film having light-generating sources with their electronically conductive circuitry deposited thereon, the lighted substrate having a thin interface tail with connectors configured to connect the deposited light-generating sources to an external power source.

At 212, the manufacturing machinery sandwiches the interposed lighted substrate between the top mold and the bottom mold.

At 214, the manufacturing machinery positions the interposed lighted substrate between the top mold and the bottom mold to expose the interface tail while the molds are sandwiched together. As mentioned above, a contact-and-tail may be used in the alternative.

At 216, the manufacturing machinery introduces a light-transmissive thermoplastic encapsulating material in between the top and bottom molds and covering, at least a portion of, the lighted substrate;

At 218, the manufacturing machinery fuses the top and bottom and thermoplastic encapsulating material together.

Deposited Light-Generating Sources

Conventionally, the smallest produced surface-mount LEDs are about 1.0 mm long by 0.8 mm wide and 0.2 mm thick. An example of a light-generating component that is contemplated to be used with the technology described herein is described in U.S. Pat. No. 8,415,879, which is titled "Diode for a Printable Composition." These semi-conductor light-generating sources are called "printable light-emitting diodes" or more generally "placeable" LEDs. That maybe generally called pLEDs herein.

Each pLED has a cross-section with a maximum length of 3 to 50 microns. Indeed, in some implementations, the light-generating component has a cross-section with a maximum length of 15 to 20 microns. This is about thirty to fifty times smaller than the smallest conventional surface-mount LEDs available.

Using the pLEDs, each group of light-generating sources contains about two-thousand sources in some implementations. In other implementations, a group may contain as much as five-thousand sources.

Of course, other implementations may use different technology for the light-generating sources that may be deposited on a thin layer of material (e.g., 0.07 to 0.25 mm thick) and in an electrically conductive manner.

Of course, other suitable light-generating sources may be used with implementations discussed herein and otherwise contemplated. In some implementations, a suitable light-generating source is smaller than 1.0 mm long by 0.8 mm wide and 0.2 mm thick and is larger than includes light-emitting semiconductors that each has a cross-section with a maximum length of 3 to 50 microns.

Deposition of Light-Generating Sources

Implementations of the technology described herein that use the pLEDs involve a disposition (e.g., printing, spraying, etc.) of printable light-emitting diodes that are suspended in a liquid or gel (e.g., ink).

The process of placing the light-generating sources that are suspended in a liquid or gel on the lightplate is called "liquid deposition" herein. The liquid deposition may be accomplished by printing, spraying, or other such application processes. Indeed, the liquid deposition may be accomplished on a conventional printing press, screen press, ink jet printing, or other printing technology.

Deposition, as used herein, of light-generating sources involves the placement of such sources on a surface and in such a manner so that it is or can be linked electronically to a power source. Disposition does not include surface mounting as is accomplished with conventional LEDs. Rather, deposition herein includes, for example, liquid deposition, printing, spraying, lithography, electrophotography, ejection, squirting, shooting, electrophoresis, electroplating, and the like onto a surface.

Of course, other implementations may use different technology for the light-generating sources that may be deposited on a thin layer of material (e.g., 0.07 to 0.25 mm thick), such as a thin film, underneath the keys and in an electrically conductive manner.

With the existing printed LED technology, the pLEDs are suspended in a liquid or gel (e.g., ink). That pLED ink is printed on a surface. Indeed, this printed may be accomplished on a conventional printing press or screen press.

An example of an existing pLED printing process includes:

printing a trace of conductive material (e.g., silver ink or clear ink with conductive nano-fibers) on non-conductive substrate (e.g., polyester);

using ink with pLEDs dispersed therein, printing shapes/areas/regions of pLEDs over the traces;

printing a dielectric (i.e., insulating) layer to separate conductive material layers;

printing another trace of conductive material (e.g., silver ink or clear ink with conductive nano-fibers) over the shapes/areas/regions of pLEDs thus completing a circuit (once attached to a power source) therethrough the pLEDs.

Placement of Light-Generating Sources

Alternative implementations of the technology described herein may employ precisely placed unpackaged LEDs. For example, very tiny unpackaged LEDs may be placed onto a substrate with a printed circuitry via a mechanical apparatus using one or more various techniques to pick-and-place the LEDs (e.g., magnetics, electrostatic, van der Waals force, etc.).

Additional and Alternative Implementation Notes

In the above description of exemplary implementations, for purposes of explanation, specific numbers, materials configurations, and other details are set forth in order to better explain the present invention, as claimed. However, it will be apparent to one skilled in the art that the claimed invention may be practiced using different details than the exemplary ones described herein. In other instances, well-known features are omitted or simplified to clarify the description of the exemplary implementations.

The inventor intends the described exemplary implementations to be primarily examples. The inventor does not intend these exemplary implementations to limit the scope of the appended claims. Rather, the inventor has contemplated that the claimed invention might also be embodied and implemented in other ways, in conjunction with other present or future technologies.

Moreover, the word "exemplary" is used herein to mean serving as an example, instance, or illustration. Any aspect or design described herein as exemplary is not necessarily to be construed as preferred or advantageous over other aspects or designs. Rather, use of the word "exemplary" is intended to present concepts and techniques in a concrete fashion. The term "technology," for instance, may refer to one or more devices, apparatuses, systems, methods, articles of manufacture, and/or computer-readable instructions as indicated by the context described herein.

As used in this application, the term "or" is intended to mean an inclusive "or" rather than an exclusive "or." That is, unless specified otherwise or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more," unless specified otherwise or clear from context to be directed to a singular form.

These processes are illustrated as a collection of blocks in a logical flow graph, which represents a sequence of operations that can be implemented in mechanics alone or a combination with hardware, software, and/or firmware. In the context of software/firmware, the execution of the instructions on the medium may cause performance of the operations described herein. For example, or more computer-readable media with processor-executable instructions stored thereon which when executed by one or more processors may cause performance of operations described herein.

Note that the order in which the processes are described is not intended to be construed as a limitation, and any number of the described process blocks can be combined in any order to implement the processes or an alternate process. Additionally, individual blocks may be deleted from the processes without departing from the spirit and scope of the subject matter described herein.

What is claimed is:

1. A method of substrate insert molding (SIM), the method comprising:
    positioning a light substrate between a top mold and a bottom mold, the top mold and the bottom mold being made of a material including polycarbonates and acrylics, the light substrate including:
        a film substrate defining a plane and having a tail extending therefrom in the plane defined by the film substrate, the film substrate and the tail formed of a single continuous piece of a non-conductive material,
        a light-generating source having electronically conductive circuitry, the light-generating source being attached to the film substrate, and
        a trace extending along the tail from the film substrate and configured to connect the circuitry of the light-generating source to a power source;
    depositing a light-transmissive material in between the top mold and the bottom mold so as to cover at least a portion of the light substrate; and
    fusing the top mold, the bottom mold, the light substrate, and the light-transmissive material together;
    wherein the tail protrudes out from between the fused top mold and bottom mold in the plane defined by the film substrate and is void of any hole around the tail.

2. A method according to claim 1, wherein the fusing includes heating and pressing.

3. A method according to claim 1, wherein the light-transmissive material mechanically bonds with the light substrate during the fusing.

4. A method according to claim 1, wherein the light-transmissive material includes a thermoplastic resin.

5. A method according to claim 1, wherein the light-transmissive material includes a thermoplastic resin selected from a group consisting of polycarbonates and acrylics.

6. A method according to claim 1, wherein the light-transmissive material includes pigments therein.

7. A method according to claim 1, wherein the light-transmissive material includes phosphor therein.

8. A method according to claim 1, further comprising including a diffusing layer on one side of the light substrate.

9. A method according to claim 1, wherein the light substrate includes a plurality of light-generating sources organized into a plurality of light-generating groups.

10. A method according to claim 1, wherein the light-generating source is a light-emitting semiconductor.

11. A method according to claim 1, wherein the light-generating source has a cross-section with a maximum length of 3 to 50 microns.

12. An electronic product sealed against liquid ingress in accordance with a method comprising:
    positioning a light substrate between a top mold and a bottom mold, the top mold and the bottom mold being made of a material including polycarbonates and acrylics, the light substrate including:
        a film substrate defining a plane and having an interface tail extending therefrom in the plane defined by the film substrate, the film substrate and the interface tail formed of a single continuous piece of a non-conductive material;
        light-generating sources having electronically conductive circuitry, the light-generating sources deposited on the film substrate, and
        a trace extending along the interface tail from the film substrate and configured to connect the light-generating sources to an external power source;

exposing a portion of the interface tail outside an area of the top mold and the bottom mold;

depositing a light-transmissive thermoplastic material in between the top mold and the bottom mold, thereby covering at least a portion of the light substrate in the light-transmissive thermoplastic material; and fusing the top mold, the bottom mold, the light substrate, and the light-transmissive thermoplastic material together;

wherein the interface tail protrudes out from between the fused top mold and bottom mold in the plane defined by the film substrate and is void of any hole around the tail.

13. The method according to claim 1, wherein the light-generating source is a light emitting diode (LED).

14. The method according to claim 12, wherein the light-generating sources include light emitting diodes (LEDs).

15. The method according to claim 12, wherein the light-transmissive material includes diffusing properties.

16. An apparatus, comprising:
a light substrate including:
a film substrate defining a plane and having a tail extending therefrom in the plane defined by the film substrate, the film substrate and the tail formed of a single continuous piece of a non-conductive material,
a conductive trace deposited directly onto the film substrate, the conductive trace extending along the tail from the film substrate,
light-generating sources deposited onto the conductive trace deposited directly onto the film substrate, wherein the conductive trace extending along the tail from the film substrate is configured to connect the light-generating sources to a power supply;
a top mold disposed vertically above the light substrate;
a bottom mold disposed vertically beneath the light substrate; and
light-transmissive material disposed adjacent the light substrate, the light-transmissive material covering at least a portion of the light substrate,
wherein the top mold and the bottom mold are made of a material including polycarbonates and acrylics, and
wherein the light substrate, the top mold, the bottom mold, and the light-transmissive material are fused together;
wherein the tail protrudes out from between the fused top mold and bottom mold in the plane defined by the film substrate and is void of any hole around the tail.

17. The apparatus according to claim 16, wherein the light-generating sources include light emitting diodes (LEDs).

* * * * *